United States Patent

Krummacher et al.

(10) Patent No.: US 9,859,524 B2
(45) Date of Patent: Jan. 2, 2018

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Benjamin Krummacher, Regensburg (DE); Joerg Farrnbacher, Regensburg (DE); Simon Schicktanz, Regensburg (DE); Kilian Regau, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/979,624

(22) Filed: Dec. 28, 2015

(65) Prior Publication Data

US 2016/0118622 A1   Apr. 28, 2016

Related U.S. Application Data

(63) Continuation of application No. PCT/EP2014/062566, filed on Jun. 16, 2014.

(51) Int. Cl.
*H01L 33/00* (2010.01)
*H01L 51/52* (2006.01)
*H01L 51/44* (2006.01)
*H01L 51/56* (2006.01)

(52) U.S. Cl.
CPC ........ *H01L 51/5253* (2013.01); *H01L 51/441* (2013.01); *H01L 51/448* (2013.01);
(Continued)

(58) Field of Classification Search
CPC . H01L 51/5253; H01L 51/441; H01L 51/448; H01L 51/5206; H01L 51/5221;
(Continued)

(56) References Cited

U.S. PATENT DOCUMENTS 3,983,295 A * 9/1976 Murer .................. C08J 9/14
  264/236
5,621,636 A * 4/1997 Tanigawa .............. H01F 19/04
  363/147

(Continued)

FOREIGN PATENT DOCUMENTS

DE   102004005370 A1   9/2005
DE   102011107642 A1   1/2013
WO       0157938 A1   8/2001

OTHER PUBLICATIONS

International Search Report based on application No. PCT/EP2014/062566 (3 pages and 2 Pages of English translation) dated Nov. 11, 2014 (for reference purpose only).
German Search Report based on application No. 10 2013 106 688.7(6 pages) dated Mar. 13, 2014 (for reference purpose only).
German Office Action based on application No. 10 2013 106 688.7 (6 pages) dated Nov. 23, 2016 (Reference Purpose Only).

*Primary Examiner* — Vu A Vu
(74) *Attorney, Agent, or Firm* — Viering, Jentschura & Partner mbB

(57) ABSTRACT

Various embodiments may relate to an optoelectronic component, including an optically active region formed for taking up and/or for providing electromagnetic radiation, at least one first contact structure, wherein the optically active region is electrically conductively coupled to the first contact structure, and an encapsulation structure with a second contact structure, wherein the encapsulation structure is formed on or above the optically active region and the first contact structure, and an electrically conductive structure formed for electrically conductively connecting the first contact structure to the second contact structure, wherein the encapsulation structure is at least partly formed by an electrically insulating molding compound, wherein the electrically insulating molding compound at least partly surrounds the electrically conductive structure.

16 Claims, 5 Drawing Sheets

(52) U.S. Cl.
CPC ........ *H01L 51/5203* (2013.01); *H01L 51/524* (2013.01); *H01L 51/5206* (2013.01); *H01L 51/5221* (2013.01); *H01L 51/56* (2013.01); *H01L 2251/5361* (2013.01); *H01L 2251/558* (2013.01)

(58) Field of Classification Search
CPC ............. H01L 51/56; H01L 2251/5361; H01L 2251/558
USPC .......................................................... 257/99
See application file for complete search history.

(56) References Cited

U.S. PATENT DOCUMENTS

| | | | |
|---|---|---|---|
| 7,138,667 B2* | 11/2006 | Barnett | ..................... F21V 3/04 257/676 |
| 7,731,402 B2* | 6/2010 | Tessnow | .............. F21S 48/1154 362/241 |
| 7,893,452 B2* | 2/2011 | Harle | ................... H01L 33/507 257/99 |
| 2003/0062829 A1 | 4/2003 | Heimgartner et al. | |
| 2004/0160166 A1 | 8/2004 | Cok | |
| 2010/0157585 A1 | 6/2010 | Diekmann et al. | |
| 2012/0099331 A1 | 4/2012 | Yamazaki et al. | |
| 2013/0112963 A1 | 5/2013 | Ingle | |
| 2014/0217381 A1 | 8/2014 | Vogt et al. | |

\* cited by examiner

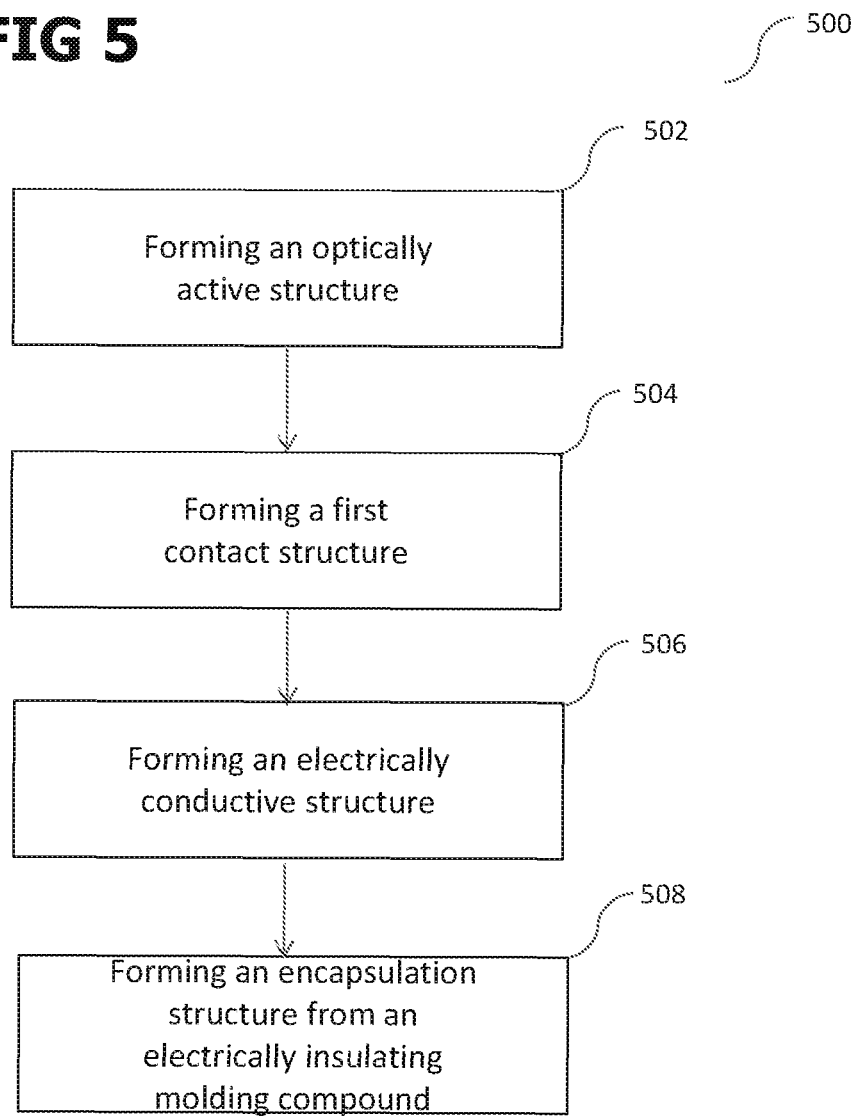

OPTOELECTRONIC COMPONENT AND METHOD FOR PRODUCING AN OPTOELECTRONIC COMPONENT

RELATED APPLICATIONS

The present application is a continuation of PCT application No.: PCT/EP2014/062566 filed on Jun. 16, 2014 which claims priority from German application No.: 10 2013 106 688.7 filed on Jun. 26, 2013, and is incorporated herein by reference in its entirety.

TECHNICAL FIELD

In various embodiments, an optoelectronic component and a method for producing an optoelectronic component are provided.

BACKGROUND

Optoelectronic components on an organic basis, for example organic light emitting diodes (OLED), are being increasingly widely used in general lighting, for example as a surface light source. An OLED may include an anode and a cathode with an organic functional layer system therebetween. The organic functional layer system may include one or a plurality of emitter layer(s) in which electromagnetic radiation is generated. An OLED can also be used as a photodetector in reverse operation. Furthermore, organic solar cells are known as optoelectronic components.

From the viewpoint of users, an optoelectronic component should be able to be incorporated into a device or a component as simply as possible and without relatively deep previous technical knowledge.

Therefore, optoelectronic components should be formed in such a way as to comply with prescribed standards, for example for electrical insulation with respect to air gaps and creepage paths, in the application by means of the form of the optoelectronic component. Furthermore, the integration of the optoelectronic component into a device should require no special outlay, for example for heat spreading on the optically active surface.

In one conventional method, an electrical insulation is provided during the production of an optoelectronic component only in the assemblage of the optoelectronic component with a plurality of other optoelectronic components produced in parallel. In other words: an electrical insulation has been provided hitherto only in the case of complete modules. Conventionally, complete electrical insulation is not achieved at the level of an individual optoelectronic component. Consequently, compliance with prescribed standards has to be taken into account when installing a conventional optoelectronic component.

In one conventional method, an optoelectronic component can be electrically contacted by metalized contact strips being formed on the carrier in the region of the overhang of the carrier by the optoelectronic component. The metalized contact strips reduced the optically active area of the optoelectronic component. Therefore, conventionally, attempts are made to form the contact strips such that they are as small as possible. Furthermore, a thin-film encapsulation can be formed on the conventional contact strips. As a result, the electrical contacting of the metalized contact strips, for example by means of a soldering connection, becomes complex from the viewpoint of users.

In one conventional method, as mechanical protection, a cover glass is laminated, or a cavity glass is adhesively bonded, onto an optoelectronic component. Coverings composed of a metal plate and in the form of lacquer coatings are furthermore known.

In one conventional method, for spreading the heat of the optoelectronic component, a heat spreader structure is applied to the optoelectronic component, for example a graphite film or a metal plate or a metal-coated film.

SUMMARY

In various embodiments, an optoelectronic component and a method for producing an optoelectronic component are provided which make it possible to form a cost-effectively producible optoelectronic component which is electrically insulated toward the surroundings, has mechanical protection and/or heat spreading; and/or enables simple electrical contacting.

In various embodiments, an optoelectronic component is provided, the optoelectronic component including: an optically active region formed for taking up and/or for providing electromagnetic radiation; at least one first contact structure, wherein the optically active region is electrically conductively coupled to the first contact structure; and an encapsulation structure with a second contact structure, wherein the encapsulation structure is formed on or above the optically active region and the first contact structure; and an electrically conductive structure formed for electrically conductively connecting the first contact structure to the second contact structure, wherein the encapsulation structure is at least partly formed by an electrically insulating molding compound, wherein the electrically insulating molding compound at least partly surrounds the electrically conductive structure.

In one configuration, the optoelectronic component can be formed as or include a photodetector, solar cell and/or light emitting diode, for example an organic light emitting diode.

In one configuration, the optoelectronic component can be formed in a planar fashion, for example as a surface light source.

In one configuration, the optically active region may include an organic functional layer structure between a first electrode and a second electrode.

In one configuration, the first electrode can be formed as an anode and the second electrode can be formed as a cathode; or the first electrode can be formed as a cathode and the second electrode can be formed as an anode.

In one configuration, the organic functional layer structure may include an intermediate electrode between a first organic functional layer structure unit and a second organic functional layer structure unit.

In one configuration, the optically active region can be formed in such a way that the first electrode, the second electrode and the intermediate electrode are electrically insulated from one another.

In one configuration, the optically active region can be formed in such a way that the first electrode and the second electrode are electrically connected to one another, wherein the intermediate electrode is electrically insulated from the first electrode and the second electrode.

In one configuration, the optically active region can be formed for DC operation and/or AC operation.

In one configuration, the optoelectronic component can furthermore include a barrier layer on the optically active region in such a way that the optically active region is hermetically sealed with respect to water and/or oxygen.

In one configuration, the first contact structure can be formed in the geometrical edge region of the optically active region.

In one configuration, the first contact structure can be at least partly exposed, for example with respect to the barrier layer and the optically active region.

In one configuration, the first contact structure can be electrically connected to the first electrode, the second electrode and/or the intermediate electrode.

In one configuration, the first contact structure may include a first contact region and at least one second contact region.

In one configuration, the first contact region can be electrically connected to the first electrode and the second contact region can be electrically connected to the second electrode.

In one configuration, the first contact structure may include a third contact region, which is electrically connected to the intermediate electrode.

In one configuration, the first contact structure can be formed in such a way that the first contact region, the second contact region and/or the third contact region are electrically insulated from one another.

In one configuration, the first contact structure can be formed in such a way that the first contact region is electrically connected to the first electrode and the second electrode; and the second contact region is electrically connected to the intermediate electrode.

In one configuration, the second contact structure can be at least partly exposed.

In one configuration, the second contact structure can be formed in a cavity in the electrically insulating molding compound, for example in a blind hole.

In one configuration, the second contact structure can be formed in such a way that it is electrically contactable with an external electrical energy source.

In one configuration, the second contact structure may include a fourth contact region and at least one fifth contact region.

In one configuration, the fourth contact region can be electrically connected to the first electrode and the fifth contact region can be electrically connected to the second electrode.

In one configuration, the second contact structure may include a sixth contact region, which is electrically connected to the intermediate electrode.

In one configuration, the second contact structure can be formed in such a way that the fourth contact region, the fifth contact region and/or the sixth contact region are electrically insulated from one another.

In one configuration, the second contact structure can be formed in such a way that the fourth contact region is electrically connected to the first electrode and the second electrode; and the fifth contact region is electrically connected to the intermediate electrode.

In one configuration, the second contact structure may include at least one of the following structures: a plug, a pin, an eye, a socket, a clamping contact, and/or a surface contact.

In one configuration, the electrically conductive structure may include or be a leadframe.

In one configuration, the electrically conductive structure may include or be a metal plate or a metal-coated film. The metal plate may include shaped regions which form for example the second contact structure, the functional region and/or the electrical contact region.

In one configuration, the electrically conductive structure and the second contact structure can be formed from one piece and/or as one piece.

In one configuration, the electrically conductive structure can furthermore include an electrical contact region, wherein the electrically conductive structure is physically and electrically connected to the first contact structure by means of the electrical contacting region.

In one configuration, the electrically conductive structure and the electrical contacting region can be formed from one piece and/or as one piece.

In one configuration, the electrical contacting region can be electromechanically connected to the first contact structure.

Close connecting and close fixing are understood to mean forming a close connection, that is to say a cohesive, positively locking and/or force-locking connection. A close connecting means is the means or medium by means of which a close connection is formed between a first body and a second body, for example an adhesive or a clip.

In one configuration, the electromechanical connection can be formed in a force-locking fashion, in a positively locking fashion and/or as a touch contact.

In one configuration, the electrical contacting region may include a mechanical spring element, a plug, a pin and/or a clamping contact.

In one configuration, the encapsulation structure can be closely connected to the optically active region, for example cohesively.

In one configuration, the cohesive connecting means can be formed in such a way that it forms a thermal coupling of optically active region and encapsulation structure.

In one configuration, the electrical connection of the second contact region to the first contact region can be mechanically fixed by means of the cohesive connection.

In one configuration, the encapsulation structure can furthermore include a functional region, wherein the functional region is formed on or above the optically active region, for example as a heat spreader structure, mirror structure, mechanical protection and/or as a lateral electrical connection. A lateral electrical connection can also be formed as a bridging of predefined regions, for example as a bridging of the optically active region.

In one configuration, the functional region can be formed in a planar fashion.

In one configuration, the functional region and the electrically conductive structure can be formed from one piece and/or as one piece.

In one configuration, the functional region can be electrically and/or physically insulated from the electrically conductive structure by means of the electrically insulating molding compound.

In one configuration, the encapsulation structure can be formed in such a way that the optoelectronic component is electrically insulated toward the outside apart from the second contact structure.

In one configuration, the encapsulation structure can have a thickness in a range of approximately 1 µm to approximately 20 000 µm. An encapsulation structure having a thickness of a few µm can be formed for example if the second contact structure is intended to be exposed and contacted on the planar side of the optoelectronic component. A larger thickness of the encapsulation structure can be necessary if the second contact structure is intended to be contacted laterally with respect to the optically active region, for example in a cavity in the molding compound.

In one configuration, the encapsulation structure can be formed in such a way that the second contact structure is arranged above the optically active region and/or above the first contact structure. As a result, for example, an optoelectronic component can be realized which can be electrically contacted in the region above the optically active region.

In one configuration, the encapsulation structure can be formed in such a way that the second contact structure is arranged alongside the optically active region and/or alongside the first contact structure. As a result, for example, an optoelectronic component can be realized which can be electrically contacted at the geometrical edge.

In one configuration, the encapsulation structure can be formed in such a way that the first contact structure and/or the second contact structure have/has a polarity reversal protection.

In one configuration, the encapsulation structure can be formed in such a way that a predefined distance is complied with between the second contact structure and the lateral geometrical edge of the optoelectronic component. The predefined distance can be for example a safety distance, for example with regard to a creepage path and/or air gap of electric current proceeding from the second contact structure.

In one configuration, the electrically insulating molding compound may include a plastic or a ceramic.

In one configuration, the electrically insulating molding compound can be formed in thermoelastic fashion in a temperature range of approximately −40° C. to approximately +80° C.

In various embodiments, a method for producing an optoelectronic component is provided, the method including: forming an optically active region for taking up and/or for providing electromagnetic radiation; forming at least one first contact structure, wherein the optically active region is electrically conductively coupled to the first contact structure; forming an electrically conductive structure; forming an encapsulation structure with a second contact structure, wherein the encapsulation structure is at least partly formed by an electrically insulating molding compound in such a way that the electrically insulating molding compound at least partly surrounds the electrically conductive structure; wherein the encapsulation structure is formed or applied on or above the optically active region and the first contact structure; and wherein the electrically conductive structure electrically conductively connects the first contact structure to the second contact structure.

In one configuration of the method, the optoelectronic component can be formed as or include a photodetector, solar cell and/or light emitting diode, for example an organic light emitting diode.

In one configuration of the method, the optoelectronic component can be formed in a planar fashion, for example as a surface light source.

In one configuration of the method, the optically active region can be formed in such a way that it includes an organic functional layer structure between a first electrode and a second electrode.

In one configuration of the method, the optically active region can be formed in such a way that the first electrode is formed as an anode and the second electrode is formed as a cathode; or wherein the first electrode is formed as a cathode and the second electrode is formed as an anode.

In one configuration of the method, the optically active region can be formed in such a way that the organic functional layer structure includes an intermediate electrode between a first organic functional layer structure unit and a second organic functional layer structure unit.

In one configuration of the method, the optically active region can be formed in such a way that the first electrode, the second electrode and the intermediate electrode are electrically insulated from one another.

In one configuration of the method, the optically active region can be formed in such a way that the first electrode and the second electrode are electrically connected to one another, wherein the intermediate electrode is electrically insulated from the first electrode and the second electrode.

In one configuration of the method, the optically active region can be formed for DC operation and/or AC operation.

In one configuration of the method, the method can furthermore include forming a barrier layer on the optically active region in such a way that the optically active region is hermetically sealed with respect to water and/or oxygen.

In one configuration of the method, the first contact structure can be formed in the geometrical edge region of the optically active region.

In one configuration of the method, the first contact structure can be formed such that it is at least partly exposed, for example with respect to the barrier layer and the optically active region.

In one configuration of the method, the first contact structure can be electrically connected to the first electrode, the second electrode and/or the intermediate electrode.

In one configuration of the method, the first contact structure can be formed in such a way that the first contact structure includes a first contact region and at least one second contact region.

In one configuration of the method, the first contact region can be electrically connected to the first electrode and the second contact region can be electrically connected to the second electrode.

In one configuration of the method, the first contact structure can be formed in such a way that the first contact structure includes a third contact region, which is electrically connected to the intermediate electrode.

In one configuration of the method, the first contact structure can be formed in such a way that the first contact region, the second contact region and/or the third contact region are electrically insulated from one another.

In one configuration of the method, the first contact structure can be formed in such a way that the first contact region is electrically connected to the first electrode and the second electrode; and the second contact region is electrically connected to the intermediate electrode.

In one configuration of the method, the second contact structure can be formed in such a way that it is at least partly exposed.

In one configuration of the method, the second contact structure can be formed in such a way that it is formed in a cavity in the electrically insulating molding compound, for example in a blind hole.

In one configuration of the method, the second contact structure can be formed in such a way that it is electrically contactable with an external electrical energy source.

In one configuration of the method, the second contact structure can be formed in such a way that it includes a fourth contact region and at least one fifth contact region.

In one configuration of the method, the fourth contact region can be electrically connected to the first electrode and the fifth contact region can be electrically connected to the second electrode.

In one configuration of the method, the second contact structure can be formed in such a way that it includes a sixth contact region, which is electrically connected to the intermediate electrode.

In one configuration of the method, the second contact structure can be formed in such a way that the fourth contact region, the fifth contact region and/or the sixth contact region are electrically insulated from one another.

In one configuration of the method, the second contact structure can be formed in such a way that the fourth contact region is electrically connected to the first electrode and the second electrode; and the fifth contact region is electrically connected to the intermediate electrode.

In one configuration of the method, the second contact structure can be formed in such a way that it includes at least one of the following structures: a plug, a pin, an eye, a socket, a clamping contact, and/or a surface contact.

In one configuration of the method, the electrically conductive structure can be formed as or be a leadframe.

In one configuration of the method, forming the electrically conductive structure may include processing a metal plate or a metal-coated film.

In one configuration of the method, the electrically conductive structure and the second contact structure can be formed in such a way that they are formed from one piece and/or as one piece.

In one configuration of the method, forming the electrically conductive structure can furthermore include forming an electrical contacting region in such a way that the electrically conductive structure is physically and electrically connectable to the first contact structure by means of the electrical contacting region.

In one configuration of the method, the electrically conductive structure and the electrical contacting region can be formed in such a way that they are formed from one piece and/or as one piece.

In one configuration of the method, the electrical contacting region can be electromechanically connected to the first contact structure.

In one configuration of the method, the electromechanical connection can be formed in a force-locking fashion, in a positively locking fashion and/or as a touch contact.

In one configuration of the method, the electrical contacting region can be formed in a manner including a mechanical spring element, a plug, a pin and/or a clamping contact, wherein forming the electrical connection includes compression of the spring element.

In one configuration of the method, the electrical connection can be formed during or by means of the approach of the encapsulation structure to the optically active region.

In one configuration of the method, the electrical connection can be formed after a touch contact or a close connection is formed between the encapsulation structure and the optically active region, for example by means of an electrical breakdown of electrically insulating layers between the touch contact the optically active region.

In one configuration of the method, the encapsulation structure can be closely connected to the optically active region, for example cohesively.

In one configuration of the method, the cohesive connection can be formed in such a way that the cohesive connecting means forms a thermal coupling of optically active region and encapsulation structure.

In one configuration of the method, the cohesive connection can be formed in such a way that the cohesive connecting means forms a mechanical spring element, a plug, a pin and/or a clamping contact between the optically active region and the encapsulation structure, for example by virtue of the fact that the cohesive connecting means is formed in a structured fashion, for example fills a cavity in the optically active region and/or the encapsulation structure; and/or has a mechanical elasticity. The optically active region and/or the encapsulation structure can have a complementarily shaped region with respect to the solidified and/or elastic cohesive connecting means.

In one configuration of the method, the electrical connection of the second contact region to the first contact region can be mechanically fixed by means of the cohesive connection.

In one configuration of the method, the method can furthermore include: forming a functional region; forming the encapsulation structure in such a way that the functional region is at least partly surrounded by the electrically insulating molding compound; and applying the functional region on or above the optically active region, wherein the functional region is formed for example as a heat spreader structure, mirror structure, mechanical protection and/or as a lateral electrical connection with respect to the optically active region.

In one configuration of the method, the functional region can be formed in a planar fashion.

In one configuration of the method, the functional region and the electrically conductive structure can be formed from one piece and/or as one piece.

In one configuration of the method, the functional region can be electrically and/or physically insulated from the electrically conductive structure by means of the electrically insulating molding compound.

In one configuration of the method, the encapsulation structure can be formed in such a way that the optoelectronic component is electrically insulated toward the outside apart from the second contact structure.

In one configuration of the method, the encapsulation structure can be formed in such a way that the electrically insulating molding compound has a thickness in a range of approximately 1 µm to approximately 20 000 µm.

In one configuration of the method, the encapsulation structure can be formed in such a way that the second contact structure is arranged above the optically active region and/or above the first contact structure.

In one configuration of the method, the encapsulation structure can be formed in such a way that the second contact structure is arranged alongside the optically active region and/or alongside the first contact structure.

In one configuration of the method, the encapsulation structure can be formed in such a way that the first contact structure and/or the second contact structure have/has a polarity reversal protection.

In one configuration of the method, the encapsulation structure can be formed in such a way that a predefined distance is complied with between the second contact structure and the lateral geometrical edge of the optoelectronic component.

In one configuration of the method, the electrically insulating molding compound may include a plastic or a ceramic.

In one configuration of the method, forming the encapsulation structure may include at least one primary forming method with regard to the electrically insulating molding compound, for example may include at least one of the following methods: injection molding, for example film-insert molding; mold casting; diecasting.

In one configuration of the method, the electrically insulating molding compound can be formed in thermoelastic fashion in a temperature range of approximately −40° C. to approximately +80° C.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 5 shows a schematic illustration concerning a method for forming an optoelectronic component in accordance with various exemplary embodiments.

DETAILED DESCRIPTION

Figure 1A:
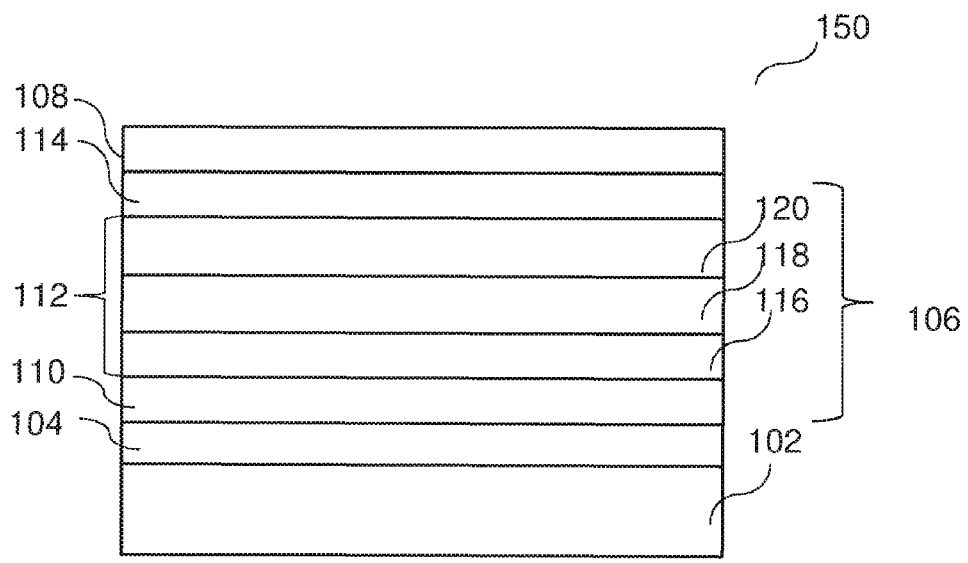
FIGS. 1A, 1B show schematic cross-sectional views of an optoelectronic component in accordance with various exemplary embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, optoelectronic components are described, wherein an optoelectronic component includes an optically active region. The optically active region can absorb electromagnetic radiation and form a photocurrent therefrom or emit electromagnetic radiation by means of a voltage applied to the optically active region. In various embodiments, the electromagnetic radiation can have a wavelength range including x-ray radiation, UV radiation (A-C), visible light and/or infrared radiation (A-C).

A planar optoelectronic component including two planar, optically active sides can be formed for example as transparent or translucent in the connection direction of the optically active sides, for example as a transparent or translucent organic light emitting diode. A planar optoelectronic component can also be formed as a plane optoelectronic component, for example as a optoelectronic component having plane-parallel optically active sides.

However, a planar optoelectronic component can also include an optically active region having a planar, optically active side and a planar, optically inactive side, for example an organic light emitting diode designed as a top emitter or a bottom emitter. The optically inactive side can for example be transparent or translucent, or be provided with a mirror structure and/or an opaque substance or substance mixture, for example for heat spreading. The mirror structure can be formed for example in an electrically switchable fashion. As a result, the beam path of the optoelectronic component can be directed on one side, for example. In other words: the optoelectronic component can be formed and/or driven in such a way that it emits an electromagnetic radiation in regard to the optically active side and appears to be transparent, translucent and/or opaque in regard to the optically inactive side.

In the context of this description, providing electromagnetic radiation can be understood to mean emitting electromagnetic radiation. In other words: providing electromagnetic radiation can be understood as emitting electromagnetic radiation by means of a voltage applied to an optically active region.

In the context of this description, taking up electromagnetic radiation can be understood to mean absorbing electromagnetic radiation. In other words: taking up electromagnetic radiation can be understood to mean absorbing electromagnetic radiation and forming a photocurrent from the absorbed electromagnetic radiation.

In various configurations, an electromagnetic radiation emitting component can be an electromagnetic radiation emitting semiconductor component and/or be formed as an electromagnetic radiation emitting diode, as an organic electromagnetic radiation emitting diode, as an electromagnetic radiation emitting transistor or as an organic electromagnetic radiation emitting transistor. The electromagnetic radiation emitting component can be formed for example as a light emitting diode (LED), as an organic light emitting diode (OLED), as a light emitting transistor or as an organic light emitting transistor. In various configurations, the electromagnetic radiation emitting component can be part of an integrated circuit. Furthermore, a plurality of electromagnetic radiation emitting components can be provided, for example in a manner accommodated in a common housing. The optoelectronic component can be formed as an organic light emitting diode, an organic photodetector, an organic solar cell, an organic field effect transistor (OFET) and/or an organic electronic system. The organic field effect transistor can be a so-called "all-OFET", in which all the layers are organic. An optoelectronic component may include an organic functional layer system, which is synonymously also designated as organic functional layer structure. The organic functional layer structure may include or be formed from an organic substance or an organic substance mixture which is designed for example for providing an electromagnetic radiation from an electric current provided. An organic light emitting diode can be formed as a top emitter or a bottom emitter. In the case of a bottom emitter, light is emitted from the electrically active region through the carrier. In the case of a top emitter, light is emitted from the top side of the electrically active region and not through the carrier. A top emitter and/or bottom emitter can also be formed as optically transparent or optically translucent; by way of example, each of the layers or structures described below can be formed as transparent or translucent.

The connection of a first body to a second body can be positively locking, force-locking and/or cohesive. The connections can be formed as releasable, i.e. reversible. In various configurations, connections can be formed as non-releasable, i.e. irreversible. A non-releasable connection can be separated only by means of the connecting means being destroyed. In various configurations, an irreversible, close connection can be realized.

In the case of a positively locking connection, the movement of the first body can be restricted by a surface of the second body, wherein the first body moves perpendicularly, i.e. normally, in the direction of the restricting surface of the second body. In other words, in the case of a positively locking connection, a relative movement of the two bodies is prevented on account of their mutually corresponding shape in at least one direction. A hook in an eye can be restricted in movement for example in at least one spatial direction. In various configurations, a positively locking connection can be realized for example as a screw connection, a hook and loop fastener, a clamp, a latching connection and/or by means of clips. Furthermore, a positively locking connection can be formed by means of an interference fit of a first body with respect to a second body. By way of example, an end section of a holding pin which is led through a holding cutout can be deformed in such a way that its cross section is larger than the holding cutout and it can no longer be led back through the holding cutout.

In the case of a force-locking connection, on account of a physical contact of the two bodies under pressure, a static friction can restrict a movement of the first body parallel to the second body. One example of a force-locking connection may be, for example, a bottle cork in a bottle neck or a dowel with an interference fit in a corresponding dowel hole. Furthermore, the force-locking connection can be formed by means of a press fit between a first body and a second body. By way of example, a diameter of the holding pin can be chosen such that it can still just be inserted into the holding cutout with deformation of the holding pin and/or of the corresponding holding cutout, but can be removed again from the latter only with increased expenditure of force.

In the case of a cohesive connection, the first body can be connected to the second body by means of atomic and/or molecular forces. Cohesive connections can often be non-releasable connections. In various configurations, a cohesive connection can be realized for example as an adhesively bonded connection, a soldered connection, for example of a glass solder, or of a metal solder, a welded connection.

In various configurations, an adhesive can be used for forming a cohesive connection. An adhesive may include or be formed from one of the following substances: a casing, a gluten, a starch, a cellulose, a resin, a tannin, a lignin, an organic substance including oxygen, nitrogen, chlorine and/or sulfur; a metal oxide, a silicate, a phosphate, a borate. In various configurations, an adhesive may include or be formed from a hot melt adhesive, for example a solvent-containing wet adhesive, a contact adhesive, a dispersion adhesive, a water-based adhesive, a plastisol; a polymerization adhesive, for example a cyanoacrylate adhesive, a methyl methacrylate adhesive, an anaerobically curing adhesive, an unsaturated polyester, a radiation-curing adhesive; a polycondensation adhesive, for example a phenol formaldehyde resin adhesive, a silicone, a silane-crosslinking polymer adhesive, a polyimide adhesive, a polysulfide adhesive; and/or a polyaddition adhesive, for example an epoxy resin adhesive, a polyurethane adhesive, a silicone, a pressure sensitive adhesive. An adhesive layer can additionally include thermally conductive particles. The thermally conductive particles may include or be formed from one of the following substances: carbon nanotubes, diamond, copper, boron nitride, aluminum, aluminum nitride, and/or aluminum oxide. The thermal conductivity of the thermally conductive particles can be in a range of approximately 28 W/mK to approximately 1120 W/mK.

In various embodiments, an electrically conductive structure, a functional region, an electrical contacting region and/or a second contact structure can be regions of a common printed circuit board or be formed as a common leadframe. Leadframes can be singulated from a leadframe assemblage, for example. The leadframe assemblage includes or is formed from an electrically conductive material, for example. The electrically conductive material includes and/or is formed from for example a metal, for example copper, for example CuW or CuMo, copper alloys, brass, nickel and/or iron, for example FeNi. The leadframes serve for example for mechanically fixing and/or for electrically contacting electronic components, such as for example chips, for example semiconductor chips, and/or optoelectronic components. For this purpose, the leadframes have in each case two leadframe sections, for example, wherein for example one of the leadframe sections has a receptacle region for receiving and/or contacting the electronic component and the other leadframe section has a contact region for electrically contacting the electronic components. Before further processing, the leadframe assemblage can be coated, for example metalized, for example in an electrolytic method, for example with silicon, nickel, palladium and/or gold or with an alloy including for example one or a plurality of the materials mentioned.

A leadframe can have for example one, two or more leadframe sections. The leadframe can be a metal structure, for example, which correspondingly has one, two or more metal pieces as leadframe sections. A plurality of leadframes and/or the corresponding leadframe sections can be held together for example in a leadframe assemblage which is a metal frame, for example. In various embodiments, a leadframe assemblage can be formed for example from a leadframe blank which is for example a planar metal plate, for example by means of a chemical method such as for example etching, or means of a mechanical method such as for example stamping. In various embodiments, the leadframe assemblage can have a multiplicity of leadframe sections which later form electrodes, for example, and which can be connected to one another by means of metal webs for example in the leadframe assemblage. In various embodiments, one of the leadframes can have the leadframe sections which form the electrodes, for example, wherein the leadframe sections are no longer physically connected to one another by means of the metal, that is to say for example after the metal webs have already been removed. Consequently, in various embodiments illustratively the electrodes form the leadframe itself or constitute singulated parts of a leadframe assemblage.

During the production of the housings, the leadframe assemblage can be embedded for example into a molding material or in a molding compound, for example in a molding method, for example an injection molding or transfer molding method. The leadframe assemblage in the molding compound can also be referred to as an encapsulation structure for an optoelectronic component. The molding material can be formed as plastic sheathing, for example. The molding material may include for example epoxy, silicone or a hybrid material including for example one of the materials mentioned. The structure including molding material and the leadframe assemblage embedded therein can also be referred to as a housing assemblage. The fact that the leadframe assemblage or the leadframes are embedded into the molding material means, for example, that the leadframes or the leadframe sections thereof are at least partly surrounded by the molding material. Parts of the leadframes can remain free of molding material. By way of example, the electrical terminals for contacting the housings, for example the leadframe sections of the housings, can be exposed at an underside of the leadframes. In addition, at a top side of the leadframes, receptacle cutouts in which the receptacle regions and/or contact regions are exposed can be free of molding material. The housings can subsequently be singulated from the housing assemblage, for example by means of sawing or cutting. The electrical contact regions of the housings are formed at an opposite side of the leadframe sections relative to the receptacle regions, such that the finished housings can be placed onto a printed circuit board and the electrical contacting region with respect to the leadframe and/or a thermal coupling of the housing to the printed circuit board can also be produced directly via the resultant physical contact between housing and printed circuit board. In this case, the printed circuit board can be for example an FR1, FR2, FR3, FR4, FR5, CEM1, CEM2, CEM3, CEM4 or CEM5 printed circuit board, for example a through-contacted FR-4 printed circuit board. A thickness of one of the housings can be for example 100 µm to 1 mm, for example 200 µm to 500 µm, for example 250 µm to 300 µm. A thickness of one of the leadframes can be for example 100 µm to 500 µm, for example 150 µm to 300 µm.

FIGS. 1A, B show schematic cross-sectional views of an optoelectronic component in accordance with various exemplary embodiments.

FIG. 1A shows a schematic cross-sectional view with the optically active region of an optoelectronic component in accordance with various exemplary embodiments.

The illustration shows a schematic view 150 of an optically active region 106 of an optoelectronic component above a carrier 102.

The optoelectronic component includes a hermetically impermeable substrate, an active region 106 and an encapsulation structure 124.

The hermetically impermeable substrate may include a carrier 102 and a first barrier layer 104.

The active region 106 is an electrically active region 106 and/or an optically active region 106. The active region 106 is for example the region of the optoelectronic component in which electric current for the operation of the optoelectronic component flows and/or in which electromagnetic radiation is generated and/or absorbed.

The electrically active region 106 may include a first electrode 110, an organic functional layer structure 112 and a second electrode 114.

The organic functional layer structure 112 may include one, two or more functional layer structure units and one, two or more intermediate layer structure(s) between the layer structure units. The organic functional layer structure 112 may include for example a first organic functional layer structure unit 116, an intermediate layer structure 118 and a second organic functional layer structure unit 120.

A second barrier layer 108 can be formed on the second electrode 114 for the purpose of hermetic sealing with respect to water and/or oxygen.

Configurations of the encapsulation structure 124 are described and illustrated in FIG. 1B to FIG. 5.

The carrier 102 may include or be formed from glass, quartz and/or a semiconductor material. Furthermore, the carrier may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN).

The carrier 102 may include or be formed from a metal, for example copper, silver, gold, platinum, iron, for example a metal compound, for example steel.

The carrier 102 can be embodied as opaque translucent or even transparent.

The carrier 102 can be a part of a mirror structure or form the latter.

The carrier 102 can have a mechanically rigid region and/or a mechanically flexible region or be formed in this way, for example as a film.

The carrier 102 can be formed as a waveguide for electromagnetic radiation, for example can be transparent or translucent with respect to the emitted or absorbed electromagnetic radiation of the optoelectronic component 100.

The first barrier layer 104 may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The first barrier layer 104 can be formed by means of one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by means of other suitable deposition methods.

In the case of a first barrier layer 104 including a plurality of partial layers, all the partial layers can be formed by means of an atomic layer deposition method. A layer sequence including only ALD layers can also be designated as a "nanolaminate".

In the case of a first barrier layer 104 including a plurality of partial layers, one or a plurality of partial layers of the first barrier layer 104 can be deposited by means of a different deposition method than an atomic layer deposition method, for example by means of a vapor deposition method.

The first barrier layer 104 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The first barrier layer 104 may include one or a plurality of high refractive index materials, for example one or a plurality of material(s) having a high refractive index, for example having a refractive index of at least 2.

Furthermore, it should be pointed out that, in various exemplary embodiments, a first barrier layer 104 can also be entirely dispensed with, for example for the case where the carrier 102 is formed in a hermetically impermeable fashion, for example includes or is formed from glass, metal, metal oxide.

The first electrode 104 can be formed as an anode or as a cathode.

The first electrode 110 may include or be formed from one of the following electrically conductive materials: a metal; a transparent conductive oxide (TCO); a network composed of metallic nanowires and nanoparticles, for example composed of Ag, which are combined with conductive polymers, for example; a network composed of carbon nanotubes which are combined with conductive polymers, for example; graphene particles and graphene layers; a network composed of semiconducting nanowires; an electrically conductive polymer; a transition metal oxide; and/or the composites thereof. The first electrode 110 composed of a metal or including a metal may include or be formed from one of the following materials: Ag, Pt, Au, Mg, Al, Ba, In, Ca, Sm or Li, and compounds, combinations or alloys of these materials. The first electrode 110 may include as transparent conductive oxide one of the following materials: for example metal oxides: for example zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, for example, $AlZnO$, $Zn_2SnO_4$, $CdSnO_3$, $ZnSnO_3$, $MgIn_2O_4$, $GaInO_3$, $Zn\ In_2O_5$ or $In_4Sn_3O_{12}$, or mixtures of different transparent conductive oxides also belong to the group of TCOs and can be used in various exemplary embodiments. Furthermore, the TCOs do not necessarily correspond to a stoichiometric composition and can furthermore be p-doped or n-doped or be hole-conducting (p-TCO), or electron-conducting (n-TCO).

The first electrode 110 may include a layer or a layer stack of a plurality of layers of the same material or different materials. The first electrode 110 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode 104 can have for example a layer thickness in a range of 10 nm to 500 nm, for example of less than 25 nm to 250 nm, for example of 50 nm to 100 nm.

The first electrode 110 can have a first electrical terminal, to which a first electrical potential can be applied. The first electrical potential can be provided by an energy source, for example a current source or a voltage source. Alternatively, the first electrical potential can be applied to an electrically conductive carrier 102 and the first electrode 110 can be electrically supplied indirectly through the carrier 102. The first electrical potential can be for example the ground potential or some other predefined reference potential.

Figure 1B:
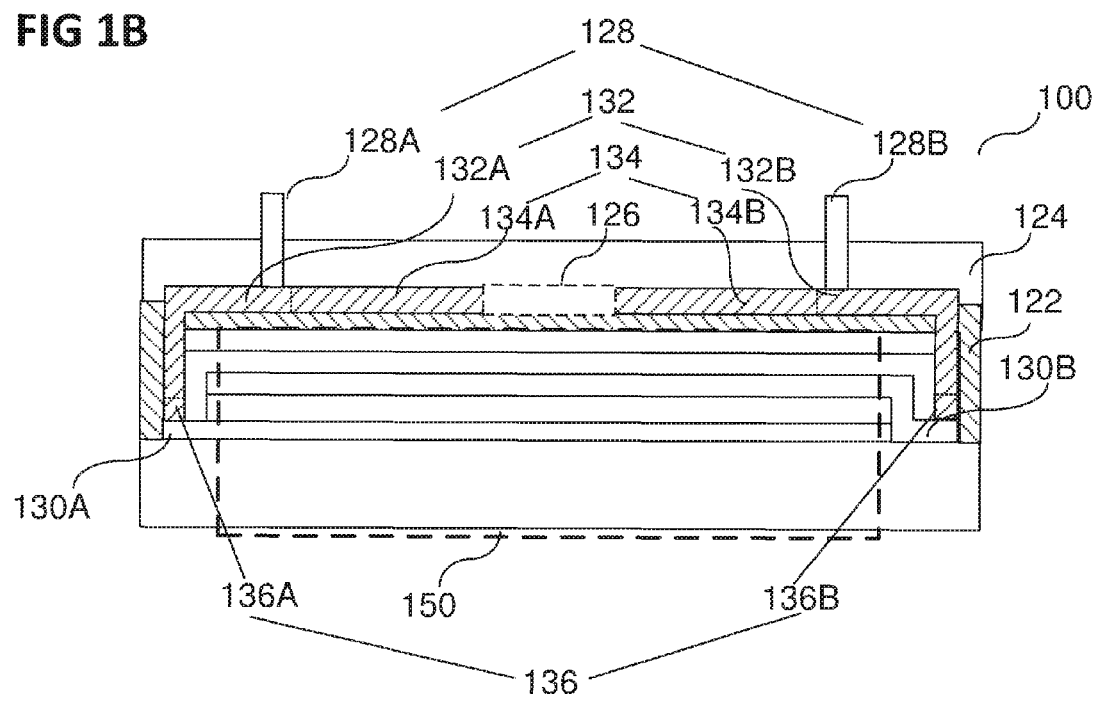

FIGS. 1A and 1B illustrate an optoelectronic component 100 including a first organic functional layer structure unit 116 and a second organic functional layer structure unit 120. In various exemplary embodiments, however, the organic functional layer structure 112 can also include one or more than two organic functional layer structures, for example 3, 4, 5, 6, 7, 8, 9, 10, or even more, for example 15 or more, for example 70.

The first organic functional layer structure unit 116 and the optionally further organic functional layer structure unit 5 can be formed identically or differently, for example include an identical or different emitter material. The second organic functional layer structure unit 120, or the further organic functional layer structure units can be formed like one of the below-described configurations of the first organic functional layer structure unit 116.

The first organic functional layer structure unit 116 may include a hole injection layer, a hole transport layer, an emitter layer, an electron transport layer and an electron injection layer.

In an organic functional layer structure unit 112, one or a plurality of the layers mentioned can be provided, wherein identical layers can have a physical contact, can be only electrically connected to one another or can even be formed in a manner electrically insulated from one another, for example can be arranged alongside one another. Individual layers of the layers mentioned can be optional.

A hole injection layer can be formed on or above the first electrode 110. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB N,N'-bis(naphthalen-2-yl)-N,N-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(napthalen-1-yl)-N,N'-bis(phenyl)-9,9-dimethylfluorene); DPFL-TPD (N,N'-bis(3-methylphenyl)-N,N'-bis(phenyl)-9,9-diphenyl-fluorene); DPFL-NPB(N,N'-bis(naphtharen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisphenyl-4-yl-amino)phenyl]-9H-fluorene; 9,9-bis[4-(N,N-bis-napthalen-2-yl-amino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)benzidine; 2,7-bis[N,N-bis(9,9-spirobifluorene-2-yl)amino)-9,9-spirobifluorene; 2,2'-bis[N,N-bis(biphenyl-4-yl)amino]9,9-spirobifluorene; 2,2'-bis(N,N-diphenylamino)9,9-spirobifluorene; di-[4-(N,N-ditolylamino)phenyl]cyclohexane; 2,2',7,7'-tetra(N,N-ditolyl)aminospirobifluorene; and/or N,N,N',N'-tetra-naphthalen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

A hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); Spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methyl-phenyl)-N,N'-bis(phenyl)-9,9-diphenylfluorene); DPFL-NPB (N,N'-bis(naphthalen-1-yl)-N,N'-bis(phenyl)-9,9-di-phenylfluorene); Spiro-TAD (2,2',7,7'-tetrakis(n,n-diphenylamino)-9,9'-spirobifluorene); 9,9-bis[4-(N,N-bis-biphenyl-4-yl-amino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N—N'-bisphenylamino)-phenyl]-9H-fluorene; N,N,-bis(phenanthren-9-yl)-N,N'-bis(phenyl)

benzidine; 2,7-bis[N,N-bis(9,9-spirobi-fluorene-2-yl) amino]-9,9-spirobifluorene; 2,2'-bis[N,N-bis(biphenyl-4-yl) amino]9,9-spirobifluorene; 2,2'-bis(N,N-diphenylamino)9, 9-spirobifluorene; di-[4-(N,N-ditolylamino)phenyl] cyclohexane; 2,2',7,7'-tetra(N,Ni-ditolyl) aminospirobifluorene; and N,N,N',N'-tetra-naphthalen-2-yl-benzidine, a tertiary amine, a carbazole derivative, a conductive polyaniline and/or polyethylene dioxythiophene.

The hole transport layer can have a layer thickness in a range of approximately 5 nm to approximately 50 nm, for example in a range of approximately 10 nm to approximately 30 nm, for example approximately 20 nm.

An emitter layer can be formed on or above the hole transport layer. Each of the organic functional layer structure units 116, 120 may include in each case one or a plurality of emitter layers, for example including fluorescent and/or phosphorescent emitters.

An emitter layer may include or be formed from organic polymers, organic oligomers, organic monomers, organic small, non-polymer molecules ("small molecules") or a combination of these materials.

The optoelectronic component 100 may include or be formed from one or a plurality of the following materials in an emitter layer: organic or organometallic compounds such as derivatives of poly-fluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)-phenyl(2-carboxypyridyl)iridium III), green phos-phorescent Ir(ppy)$_3$ (tris(2-phenylpyridine)iridium III), red phosphorescent Ru (dtb-bpy)$_3$2(PF$_6$) (tris[4,4'-di-tert-butyl-(2,2')-bipyridine]ruthenium(III) complex) and blue fluorescent DPAVBi (4,4-bis[4-(di-p-tolylamino) styryl]biphenyl), green fluorescent TTPA (9,10-bis[N,N-di-(p-tolyl)amino]anthracene) and red fluorescent DCM2 (4-di-cyanomethylene)-2-methyl-6-julolidyl-9-enyl-4H-pyran) as non-polymeric emitters.

Such non-polymeric emitters can be deposited for example by means of thermal evaporation. Furthermore, polymer emitters can be used which can be deposited for example by means of a wet-chemical method, such as, for example, a spincoating method.

The emitter materials can be embedded in a suitable manner in a matrix material, for example a technical ceramic or a polymer, for example an epoxy; or a silicone.

In various exemplary embodiments, the first emitter layer 134 can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure unit 116 may include one or a plurality of emitter layers embodied as hole transport layer.

Furthermore, the organic functional layer structure unit 116 may include one or a plurality of emitter layers embodied as electron transport layer.

An electron transport layer can be formed, for example deposited, on or above the emitter layer.

The electron transport layer may include or be formed from one or a plurality of the following materials: NET-18; 2,2',2"-(1,3,5-benzinetriyl)tris(1-phenyl-1-H-benzimidazole); 2-(4-biphenylyl)-5-(4-tert-butyl-phenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridine-6-yl)-1,3,4-oxadizo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3, 4-oxadiazo-2-yl]-2,2'-bipyridyl; 2-phenyl-9,10-di-(naphthalen-2-yl)anthracene; 2,7-bis[2-(2,2'-bi-pyridine-6-yl)-1,3,4-oxadiazo-5-yl]-9,9-dimethyl-fluorene; 1,3-bis[2-(4-tert-butylphenyl)-1,3,4-oxadi-azo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris (2,4,6-trimethyl-3-(pyridin-3-yl)phenyl)borane; 1-methyl-2-(4-naphthalen-2-yl)phenyl)-1H-imidazo[4,5-f][1,10] phenanthroline; phenyl-dipyrenylphosphine oxide; naphthalenetetra-carboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

An electron injection layer can be formed on or above the electron transport layer. The electron injection layer may include or be formed from one or a plurality of the following materials: NDN-26, MgAg, Cs$_2$CO$_3$, Cs$_3$PO$_4$, Na, Ca, K, Mg, Cs, Li, LiF; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis [2-(2,2'-biypridine-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis(5-(biphenyl-4-yl)-1,3,4-oxadiazo-2-yl]-2,2'-bipyridyl; 2-phenyl-9,10-di(naphthalen-2-yl)anthracene; 2,7-bis[2-(2, 2'-bipyridine-6-yl)-1,3,4-oxadiazo-5-yl]-9,9-dimethylfluorene; 1,3-bis[2-(4-tert-butylphenyl)-1,3,4-oxadiazo-5-yl] benzene; 2-(naphthalen-2-yl)-4,7-diphenyl-1,10-phenanthroline; 2 9-bis(naphthalen-2-yl)-4,7-diphenyl-1,10-phenanthroline; tris(2,4,6-trimethyl-3-(pyridin-3-yl)phenyl) borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 112 including two or more organic functional layer structure units 116, 120, the second organic functional layer structure unit 120 can be formed above or alongside the first functional layer structure units 116. An intermediate layer structure 118 can be formed electrically between the organic functional layer structure units 116, 120.

In various exemplary embodiments, the intermediate layer structure 118 can be formed as an intermediate electrode 118, for example in accordance with one of the configurations of the first electrode 110. An intermediate electrode 118 can be electrically connected to an external voltage source. The external voltage source can provide a third electrical potential, for example at the intermediate electrode 118. However, the intermediate electrode 118 can also have no external electrical connection, for example by the intermediate electrode having a floating electrical potential.

In various exemplary embodiments, the intermediate layer structure 118 can be formed as a charge generating layer structure 118 (charge generation layer CGL). A charge generating layer structure 118 may include one or a plurality of electron-conducting charge generating layer(s) and one or a plurality of hole-conducting charge generating layer(s). The electron-conducting charge generating layer(s) and the hole-conducting charge generating layer(s) can be formed in each case from an intrinsically conductive substance or a dopant in a matrix. The charge generating layer structure 118 should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure 118 can furthermore have a diffusion barrier between adjacent layers.

Each organic functional layer structure unit 116, 120 can have for example a layer thickness of a maximum of approximately 3 µm, for example a layer thickness of a maximum of approximately 1 µm, for example a layer thickness of a maximum of approximately 300 nm.

The optoelectronic component 100 can optionally include further organic functional layers, for example arranged on or above the one or the plurality of emitter layers or on or above the electron transport layer(s). The further organic functional layers can be for example internal or external coupling-in/coupling-out structures that further improve the functionality and thus the efficiency of the optoelectronic component 100.

The second electrode 114 can be formed on or above the organic functional layer structure 112 or, if appropriate, on or above the one or the plurality of further organic functional layer structures and/or organic functional layers.

The second electrode 114 can be formed in accordance with one of the configurations of the first electrode 110, wherein the first electrode 110 and the second electrode 114 can be formed identically or differently. The second electrode 114 can be formed as an anode, that is to say as a hole-injecting electrode, or as a cathode, that is to say as an electron-injecting electrode.

The second electrode 114 can have a second electrical terminal, to which a second electrical potential can be applied. The second electrical potential can be provided by the same energy source as, or a different energy source than, the first electrical potential and/or the optionally third electrical potential. The second electrical potential can be different than the first electrical potential and/or the optionally third electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The second barrier layer 108 can be formed on the second electrode 114.

The second barrier layer 108 can also be referred to as thin film encapsulation (TFE). The second barrier layer 108 can be formed in accordance with one of the configurations of the first barrier layer 104.

Furthermore, it should be pointed out that, in various exemplary embodiments, a second barrier layer 108 can also be entirely dispensed with. In such a configuration, the optoelectronic component 100 may include for example a further encapsulation structure, as a result of which a second barrier layer 108 can become optional, for example a cover 124, for example a cavity glass encapsulation or metallic encapsulation.

Furthermore, in various exemplary embodiments, in addition, one or a plurality of coupling-in/coupling-out layers can also be formed in the optoelectronic component 100, for example an external coupling-out film on or above the carrier 102 (not illustrated) or an internal coupling-out layer (not illustrated) in the layer cross section of the optoelectronic component 100. The coupling-in/coupling-out layer may include a matrix and scattering centers distributed therein, wherein the average refractive index of the coupling-in/coupling-out layer is greater than the average refractive index of the layer from which the electromagnetic radiation is provided. Furthermore, in various exemplary embodiments, in addition, one or a plurality of antireflection layers (for example combined with the second barrier layer 108) can be provided in the optoelectronic component 100.

FIG. 1B shows a schematic cross-sectional view concerning the electrical contacting of the optically active region 106 in accordance with one configuration of the description of FIG. 1A.

The encapsulation structure 124 may include the electrically conductive structure 132, the second contact structure 128, a functional region 134 and an electrical contacting region 136. The second contact structure 128 and the electrical contacting region 136 can be exposed, such that they can be used to form an electrical connection through the encapsulation structure 124 to the first contact structure 130.

The first contact structure 130 is electrically connected to the optically active region 106, for example to the electrodes 110, 118, 114.

The first contact structure 130 may include a first contact region 130A and at least one further contact region, for example a second contact region 130B, a third contact region (not illustrated). The first contact structure 130 may include for example the same number of contact regions as the number of mutually electrically independently contactable electrodes 110, 118, 114 of the optoelectronic component 100.

The first contact region 130A can be electrically connected to the first electrode 110 (illustrated as extension alongside the layer stack 100 in FIG. 1B). A first electrical potential can be applied to the first contact region 130A. The first electrical potential can be provided by an energy source (not illustrated), for example a current source or a voltage source. The first electrical potential can be for example the ground potential or some other predefined reference potential.

The second contact region 130B can be electrically connected to the second electrode 114 (illustrated as extension alongside the layer stack 100 in FIG. 1B). A second electrical potential can be applied to the second contact region 130B. The second electrical potential can be provided by the same energy source as the first electrical potential or a different energy source with respect thereto. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The optionally electrically contacted intermediate electrode 118 can be electrically connected to a third electrical potential by means of a third contact region. The second electrical potential can be different than the first electrical potential and/or the optionally third electrical potential.

The contact regions 130A, 130B of the first contact structure can be electrically insulated from one another or partly connected to one another and have a common electrical potential.

Further configurations of the first contact structure 130 are described and illustrated in the descriptions of FIG. 2A to FIG. 5.

The electrically conductive structure 132 is at least partly surrounded by the electrically insulating molding compound of the encapsulation structure 124. The electrically conductive structure can be closely connected to the encapsulation structure, for example in a positively locking manner, in a force-locking manner and/or cohesively.

The electrically conductive structure 132 may include a functional region 134 and/or an electrical contacting region 136. The electrically conductive structure 132 may include a plurality of electrically conductive structure units 132A, 132B in such a way that the electrodes 110, 118, 114 of the optically active region 106 can be energized electrically independently of one another, that is to say are electrically insulated from one another.

Further configurations of the electrically conductive structure 132 are described and illustrated in the descriptions of FIG. 2A to FIG. 5.

The electrical contacting region 136 can be closely connected to the electrically conductive structure 132. For example for the case where the electrical contacting region 136 is formed as a discrete component, for example in a positively locking manner or in a force-locking manner with a rivet, a pin and/or a spring element.

The electrical contacting region 136 is electrically conductively and/or physically connected to the electrically conductive structure 132, for example formed from one piece.

An integral electrically conductive structure 132 with electrical contacting region 136 can be formed for example by part of the conductive structure 132 being curved or bent in such a way that the electrical contacting region extends further in the direction of the optically active structure than the electrically insulating molding compound of the encapsulation structure 124. The electrical contacting region 136 can be used for electrically contacting the electrically conductive structure 132 with the first contact structure 130 and thus concomitantly form the external electrical linking.

The electrical contacting region 136 can be formed as a spring element that is compressed when the encapsulation structure approaches the optically active region 106. An electrical contacting region 136 formed in a compressible fashion can ensure that an electrical connection between first contact structure 130 and conductive structure 132 is formed when compression is effected. For this purpose, the electrical contacting region 136 can have a length greater than the distance between the encapsulation structure 124 and the carrier 102 after a close connection.

Further configurations of the electrical contacting region 136 are described and illustrated in the descriptions of FIG. 2A to FIG. 5.

The second contact structure 128 is electrically conductively and/or physically connected to the electrically conductive structure 132, for example formed from one piece.

A functional region 134 can be formed in the encapsulation structure 124 in such a way that the functional region 134 is at least partly surrounded by electrically insulating molding compound of the encapsulation structure 124.

The functional region 134 can be formed for example for heat spreading, as a mirror structure and/or as mechanical protection with respect to the optically active region 106.

In one configuration, the functional region 134 can be closely connected to the electrically conductive structure 132, for example cohesively, for example made from one piece. An electrical connection of the functional region 134 to the electrically conductive structure 132 can be used for example for electrically bridging contact regions (also see description of FIG. 2B).

In one configuration, the functional region 134 can be physically insulated from the electrically conductive structure 132, for example by means of the electrically insulating molding compound. The physical insulation can be formed before or after the electrically conductive structure 132 is surrounded by electrically insulating molding compound.

Further configurations of the second contact structure 128 are described and illustrated in the descriptions of FIG. 2A to FIG. 5.

The optoelectronic component 100 furthermore includes a second contact structure 128. The second contact structure 128 is electrically connected to the optically active region 106 by means of the electrodes 110, 118, 114, electrically conductive structure 132 and the first contact structure 130.

The second contact structure 128 may include a fourth contact region 128A and at least one further contact region, for example a fifth contact region 128B, a sixth contact region (not illustrated). The second contact structure 128 can have for example the same number of contact regions as the number of mutually electrically independently contactable electrodes 110, 118, 114 of the optoelectronic component 100.

The second contact structure 128 is formed in such a way that it is exposed, such that at least one electrical potential can be applied.

The fourth contact region 128A can be electrically connected to the first electrode 110 by means of the electrically conductive structure 132A. A first electrical potential can be applied to the fourth contact region 128.

The fifth contact region 128B can be electrically connected to the second electrode 114 by means of the electrically conductive structure 132B. A second electrical potential can be applied to the fifth contact region 128B.

The optionally electrically contacted intermediate electrode 118 can be electrically connected to a third electrical potential by means of a sixth contact region.

The contact regions 128A, 128B of the second contact structure can be electrically insulated from one another or partly connected to one another and have a common electrical potential.

The second contact structure 128 is electrically conductively and/or physically connected to the electrically conductive structure 132, for example formed from one piece.

An integral electrically conductive structure 132 with second contact structure can be formed for example by part of the conductive structure 132 being exposed and not covered by electrically insulating molding compound of the encapsulation structure. The exposed region can be used for electrical contacting of the electrically conductive structure 132 and thus form the second contact structure 128.

Further configurations of the second contact structure 128 are described and illustrated in the descriptions of FIG. 2A to FIG. 5.

In various exemplary embodiments, a close connection layer 122, for example composed of an adhesive or a lacquer, can be provided on or above the second barrier layer 108. By means of the close connection layer 122, an encapsulation structure 124 can be cohesively connected, for example adhesively bonded, on the second barrier layer 108. Furthermore, the electrical connection can be fixed by means of the cohesive connection.

The close connecting layer 122 can be formed as transparent or translucent.

A close connection layer 122 composed of a transparent material may include for example particles which scatter electromagnetic radiation, for example light-scattering particles. As a result, the close connection layer 122 can act as a scattering layer and can lead to an improvement in the color angle distortion and the coupling-out efficiency.

The light-scattering particles provided can be dielectric scattering particles, for example, composed of a metal oxide, for example, silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the close correction layer 122, for example air bubbles, acrylate, or hollow glass beads. Furthermore, by way of example, metallic nanoparticles, metals such as gold, silver, iron nanoparticles, or the like can be provided as light-scattering particles.

The close connection layer 122 can have a layer thickness of greater than 1 μm, for example a layer thickness of a plurality of μm. In various exemplary embodiments, the close connection layer 122 may include or be a lamination adhesive.

The close connection layer 122 can be designed in such a way that it includes an adhesive having a refractive index that is less than the refractive index of the encapsulation structure 124. Such an adhesive can be for example a low refractive index adhesive such as, for example, an acrylate having a refractive index of approximately 1.45, for example with air inclusions having a refractive index of approximately 1.3. However, the adhesive can also be a high refractive index adhesive which for example includes high refractive index, non-scattering particles and has a layer-thickness-averaged refractive index that approximately corresponds to the average refractive index of the organic functional layer structure 112, for example in a range of approximately 1.7 to approximately 2.0. Furthermore, a plurality of different adhesives can be provided which form an adhesive layer sequence.

In various exemplary embodiments, between the second electrode 114 and the close connection layer 122, an electrically insulating layer (not shown) can also be applied, for example SiN, for example having a layer thickness in a range of approximately 300 nm to approximately 1.5 μm, for example having a layer thickness in a range of approximately 500 nm to approximately 1 μm, in order to protect electrically unstable materials, during a wet-chemical process for example.

In various exemplary embodiments, a close connection layer 122 can be optional, for example if the encapsulation structure 124 is formed directly on the second barrier layer 108, for example an encapsulation structure 124 composed of glass that is formed by means of plasma spraying.

Furthermore, a so-called getter layer or getter structure, i.e. a laterally structured getter layer, can be arranged (not illustrated) on or above the optically active region 106.

The getter layer may include or be formed from a material that absorbs and binds substances that are harmful to the optically active region 106. A getter layer may include or be formed from a zeolite derivative, for example. The getter layer can be formed as translucent, transparent or opaque. The getter layer can have a layer thickness of greater than approximately 1 μm, for example a layer thickness of a plurality of μm.

In various exemplary embodiments, the getter layer may include a lamination adhesive or be embedded in the close connection layer 122.

An encapsulation structure 124 can be formed on or above the close connection layer 122. The encapsulation structure 124 can be closely connected to the optically active region 106 by means of the close connection layer 122 and protect said optically active region against harmful substances.

The encapsulation structure 124 is formed by an electrically insulating molding compound, for example a plastic or a ceramic, for example a technical ceramic.

The encapsulation structure 124 and/or the close connection layer 122 can have a refractive index (for example at a wavelength of 633 nm) of 1.55.

Figure 2A:
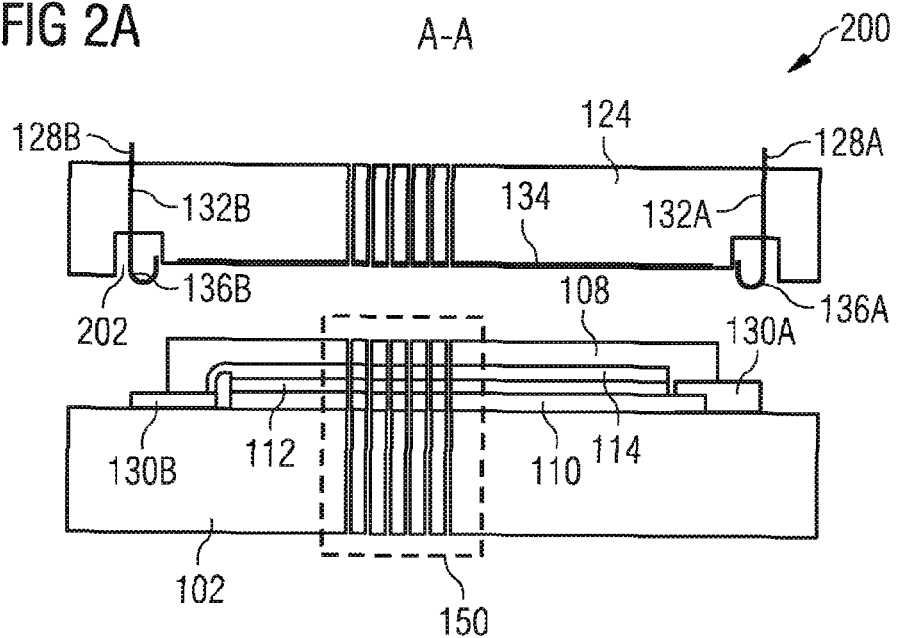
FIGS. 2A, 2B show schematic cross-sectional views of an optoelectronic component in accordance with various exemplary embodiments.
Figure 2B:
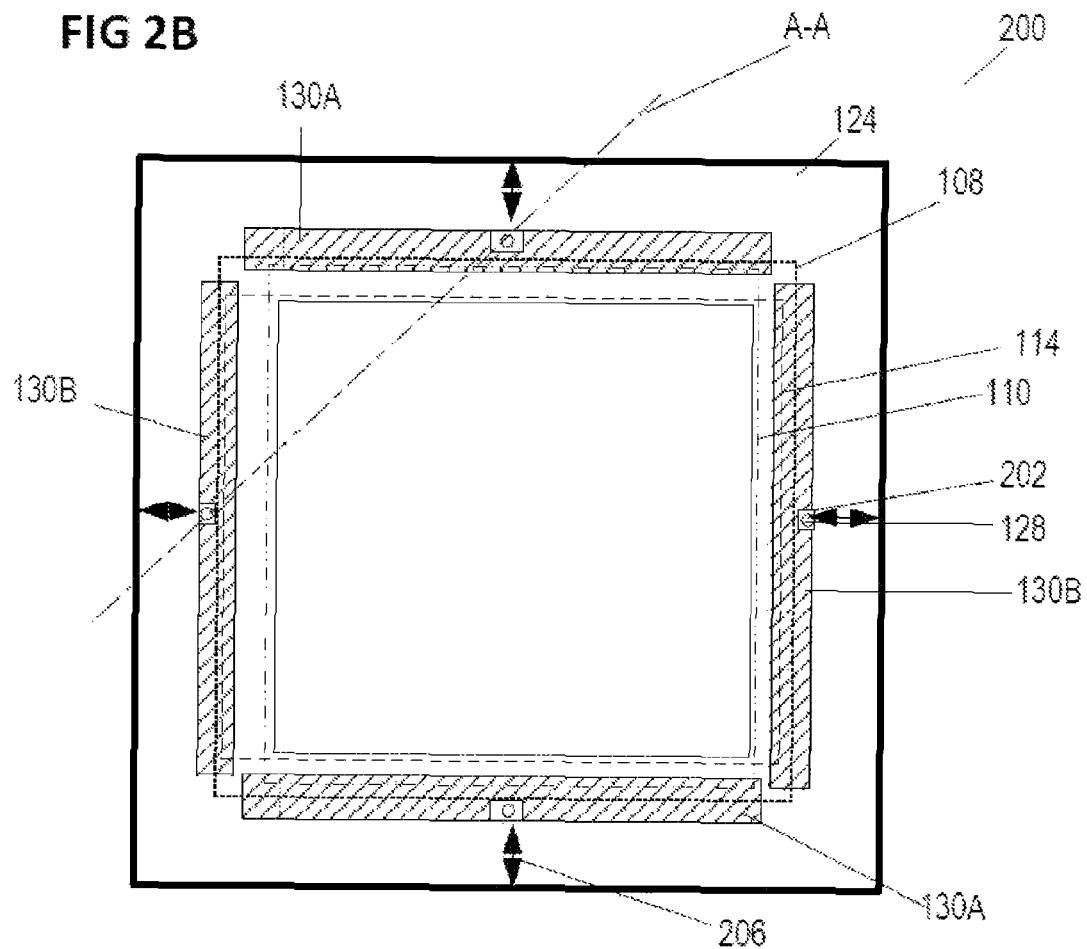

FIGS. 2A, 2B show schematic cross-sectional views of an optoelectronic component in accordance with various exemplary embodiments.

FIG. 2A illustrates an encapsulation structure 124 before the latter was closely connected to the optically active region 106.

The electrically conductive structure 132 and the functional region 134 can be formed independently of one another, i.e. in a manner spatially insulated from one another, in the encapsulation structure 124 (illustrated in FIG. 2A).

The electrically conductive structure 132 and the second contact structure 128 can be formed from one piece, i.e. integrally. The electrical contacting region 136 can be formed as a curved or bent region of the electrically conductive structure 132. By way of example, the electrically conductive structure 132 can be shaped from a metal plate and have a U-shaped cross section in one region. The U-shaped cross section (illustrated in FIG. 2A) can serve as a second contact structure 128 for an external plug.

The second contact region 128 can have a predefined distance 206 at the lateral, geometrical edge of the optoelectronic component. As a result, it is possible to realize a required safety distance, for example with respect to an air gap or creepage path of current, by means of the geometry of the optoelectronic component.

The second contact region 128 can be for example at a distance 206 from the closest edge region with an absolute value (illustrated by means of the double-headed arrows 206 in FIG. 2B) which minus all manufacturing tolerances is for example greater than 1.48 mm in the case of a maximum DC voltage of 120 V; or more than 1.24 mm in the case of a maximum DC voltage of 60 V (safety extra low voltage SELV) in DC operation (direct current DC) by means of a provided electronic ballast of the optoelectronic component 100.

In the effect of the distance 206 as safety distance, no electrically conductive structures are formed in the region between the second contact structure 128 and the component edge. In this region, therefore, there is also no exposed electrode 110, 118, 114 and contact regions 130A, 130B; for example no exposed first electrode 110 on the carrier 102.

In one configuration, such an arrangement can be formed by means of structured printing of metal pastes and electrode formulations, for example in accordance with one of the configurations of the first electrode (FIGS. 1A and 1B), for example graphene, Ag needles, etc.; in lacquers.

In one configuration, such an arrangement can be formed by means of a laser process. Such a laser process can be implemented for example as in the case of a conventional edge deletion process when preparing adhesive tracks in the production of photovoltaic installations.

In one configuration, such an arrangement can be formed by means of a structured ITO layer (as first electrode) on the carrier.

In one exemplary embodiment, the encapsulation structure 124 may include a metallic structure, for example a metal plate or a metal-coated film, as functional region 134. The metallic structure can act as a defined, plane support with respect to the optically active region 106 and with respect to lateral heat spreading. The functional structure 134 is surrounded by an electrically insulating or poorly electrically conductive material as encapsulation structure 124, for example by a plastic or a ceramic.

In one configuration of the carrier composed of an electrically insulating material, for example a glass; an electrically insulating encapsulation structure 124, for example a plastic; and an offset contact geometry of the first electrode, the optoelectronic component is electrically insulated toward the surroundings.

FIG. 2B shows a schematic plan view of an optoelectronic component in accordance with various exemplary embodiments.

The first contact structure may include a plurality of first contact regions 130A and a plurality of second contact regions 130B (illustrated as respectively opposite contact strips in FIG. 2B). The plurality of first contact regions 130A and respectively second contact regions 130B have a common, i.e. identical, electrical potential. The plurality of first contact regions 130A and respectively second contact regions 130B can be electrically connected to one another by means of the functional region 134. In other words: the functional region 134, for example in the form of a plate, can bridge the plurality of regions having an identical electrical potential. The number of electrodes to be contacted can be reduced as a result (see FIG. 3, for example).

Figure 3:
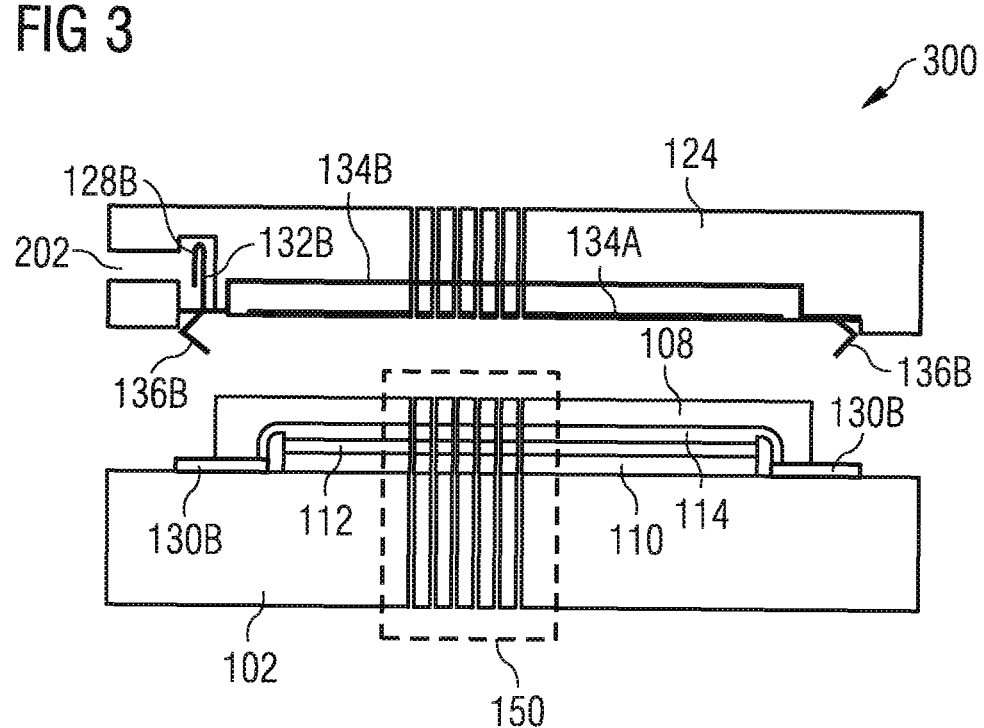
FIG. 3 shows a schematic cross-sectional view of an optoelectronic component in accordance with various exemplary embodiments.

FIG. 3 shows a schematic cross-sectional view of an optoelectronic component in accordance with various exemplary embodiments.

An encapsulation structure 124 is illustrated before it was closely connected to the optically active region 106.

The second contact structure 128 can be formed in the encapsulation structure 124 and can be at least partly exposed. By way of example, the second contact structure 128 can be formed as a metal body in a cavity 202 in plastic and electrically connect the optically active region 106 to the surroundings of the optoelectronic component 100.

In the cavity 202, the second contact structure 128, for example a metal body, contacts by means of the electrically conductive structure 132 and the electrical contacting region 136, for example in the form of a spring contact 136; the first contact structure 130 above the carrier 102 of the optoelectronic component. On the other side of the second contact structure 128, an electrical connector (not illustrated in FIG. 3) shaped complementarily to the second contact structure 128 can be electrically connected to the second contact structure 128. The other side of the second contact structure 128 can also be designated outside the optoelectronic component 100. The electrical connector can be formed for example in the form of a plug.

The electrical contacting region 136 and the second contact region 128 can be formed at identical or different regions of the electrically conductive structure 132.

The first contact structure may include a plurality of first contact regions 130A and a plurality of second contact regions 130B (illustrated for the second contact region 130B in FIG. 3). The plurality of first contact regions 130A and respectively second contact regions 130B have a common, i.e. identical, electrical potential. The plurality of first contact regions 130A and respectively second contact regions 130B can be electrically connected to one another by means of the functional region 134. In FIG. 3, this is illustrated in a lateral cross-sectional view for the bridging of a plurality of second contact regions 130B by means of a second functional region 134B and in a cross-sectional view for the bridging of a plurality of first contact regions 130A by means of a first functional region 134A. An electrically conductive structure 132 may include a plurality of electrically conductive structure units 132A, 132B and thus have a plurality of functional regions 134A, 134B. The bridging makes it possible to reduce the number of electrodes to be contacted which can be necessary for example for the case where the electrodes have a low transverse conductivity.

In one configuration, the cavity 202 together with the second contact structure 128 can be formed as a socket for an external connector.

Figure 4:
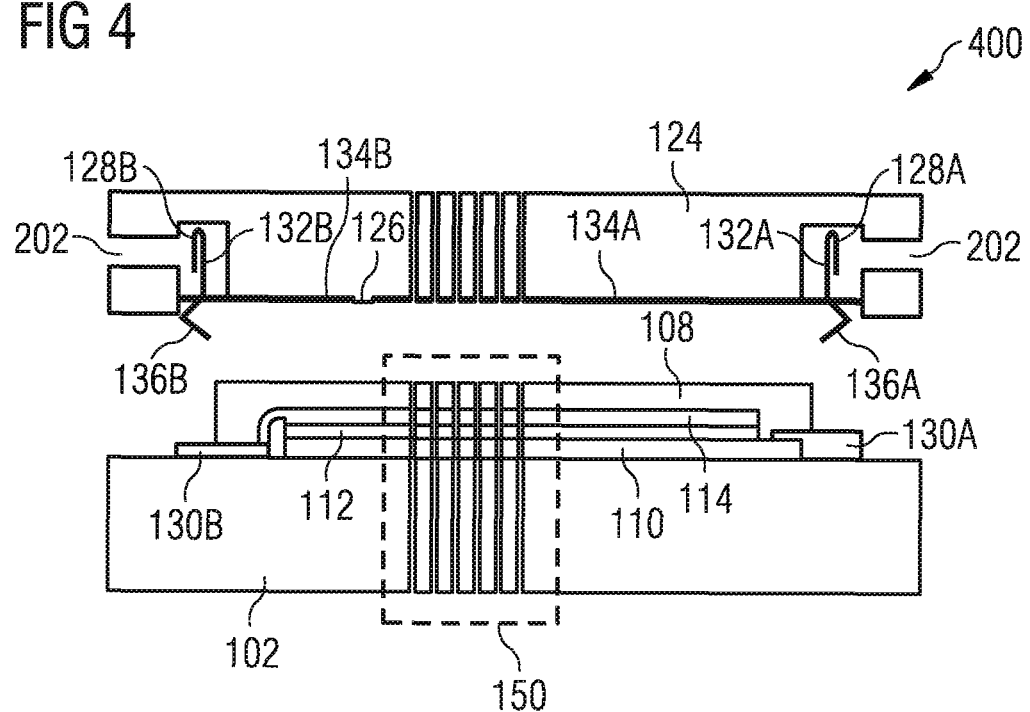
FIG. 4 shows a schematic cross-sectional view of an optoelectronic component in accordance with various exemplary embodiments.

FIG. 4 shows a schematic cross-sectional view of an optoelectronic component in accordance with various exemplary embodiments.

An encapsulation structure 124 is illustrated before it was closely connected to the optically active region 106.

In one configuration, the electrical contacting region 136, for example in the form of a spring contact, and the second contact structure 128 are cut and/or stamped from a heat spreading plate. The second contact structure 128, for example in the form of a receptacle element, can be formed as one complementary half of a plug connection. The second contact structure 128 can be exposed at the surface of the encapsulation structure 124 or be formed such that it is exposed in a cavity 202 of the electrically insulating molding compound of the encapsulation structure 124. In other words: the encapsulation structure can be formed in such a way that a cavity 202 is formed around the second contact structure 128. The cavity 202 can be formed by the electrically insulating molding compound surrounding the electrically conductive structure in such a way that the second contact structure 128 is exposed, for example by means of mold casting. In another configuration, the cavity 202 can be formed by the electrically insulating molding compound being removed from the encapsulation structure 124 in the region of the cavity 202 or around the second contact structure 128. Such formation of the cavity by means of exposure can be carried out for example by means of a chemical method, a mechanical method or a ballistic method, for example etching, dissolving; cutting, grinding; laser ablation, UV exposure.

Ballistic exposure of the regions to be exposed can be realized for example by means of the bombardment of the region to be exposed with particles, molecules, atoms, ions, electrons and/or photons.

Bombardment with photons can be realized for example as a laser with a wavelength in a range of approximately 200 nm to approximately 1700 nm, can be formed for example in a focused fashion, for example with a focus diameter in a range of approximately 10 µm to approximately 2000 µm, for example in a pulsed fashion, for example with a pulse duration in a range of approximately 100 fs to approximately 0.5 ms, for example with a power of approximately 50 mW to approximately 1000 mW, for example with a power density of approximately 100 kW/cm$^2$ to approximately 10 GW/cm$^2$ and for example with a repetition rate in a range of approximately 100 Hz to approximately 1000 Hz.

In order to avoid an electrical short circuit, the second contact structure 128 may include a fourth contact region 128A and at least one fifth contact region 128B. These can be electrically insulated from one another, for example by virtue of the encapsulation structure 124 having a plurality of conductive structures 132A, 132B that are electrically insulated from one another. In the case of a conductive structure having a functional region 134, for example a heat spreading, for example electrically conductive, plate, at least two separated plates are used in order to avoid a short circuit of the fourth contact region 128A with the fifth contact region 128B. Such a separation can be effected for example by means of removal of part of the conductive structure 132 or of the functional region 134 (illustrated by means of the interruption 126 in FIG. 4).

FIG. 5 shows a schematic illustration concerning a method for forming an optoelectronic component in accordance with various exemplary embodiments.

The method 500 for forming an optoelectronic component may include forming 502 an optically active region 106 for taking up and/or for providing electromagnetic radiation.

The method 500 for forming an optoelectronic component may include forming 504 at least one first contact structure 130, wherein the optically active region 106 is electrically conductively coupled to the first contact structure 130.

The method 500 for forming an optoelectronic component may include forming 506 an electrically conductive structure 132 and forming 508 an encapsulation structure 124 with a second contact structure 128.

The encapsulation structure 124 can be at least partly formed by an electrically insulating molding compound in such a way that the electrically insulating molding compound at least partly surrounds the electrically conductive structure 132.

Furthermore, the encapsulation structure 124 is formed or applied on or above the optically active region 106 and the first contact structure 130.

Furthermore, the encapsulation structure 124 is formed in such a way that the electrically conductive structure 132 electrically conductively connects the first contact structure 130 to the second contact structure 128.

The encapsulation structure 124 can be produced in the injection molding method, for example by means of the electrically conductive structure 132 and the (optionally) functional region 134 being encapsulated by injection molding.

Furthermore, forming the encapsulation structure 124 may include forming an electrical contacting region 136, for example in the form of a mechanically resilient structure. The second contact structure 128 and the electrical contacting region 136 can be in an exposed state or be exposed by being subjected to an exposure process. The second contact structure 128 and the electrical contacting region 136 can be exposed for example by means of an electrical breakdown, for example by a breakdown voltage being applied across the second contact structure 128 and the electrical contacting region 136. Dielectric layers therebetween can thereby be subjected to breakdown, such that an electrical connection through the encapsulation structure 124 to the first contact structure 130 can be formed.

In various embodiments, an optoelectronic component and a method for producing an optoelectronic component are provided which make it possible to form a cost-effectively producible optoelectronic component which is electrically insulated toward the surroundings, has mechanical protection and/or heat spreading; and/or enables simple electrical contacting.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

What is claimed is:

1. An optoelectronic component, comprising:
an optically active region formed for taking up and/or for providing electromagnetic radiation;
a first contact structure electrically conductively coupled to the optically active region wherein the first contact structure and the optically active region are arranged laterally alongside to each other on a common substrate;
an encapsulation structure on or above the optically active region and the first contact structure, wherein the encapsulation structure at least has an electrically insulating molding compound, wherein the optically active region and the first contact structure are encapsulated by the encapsulation structure; and
a leadframe including an electrically conductive structure and a second contact structure, wherein the electrically conductive structure is at least partly embedded into the electrically insulating molding compound of the encapsulation structure,
the second contact structure being at least partly exposed and the electrically conductive structure electrically conductively connecting the first contact structure to the second contact structure,
the electrically conductive structure including an electrical contact region, wherein the electrically conductive structure is electromechanically connected to the first contact structure by means of the electrical contacting region,
the electromechanical connection being in a force-locking fashion.

2. The optoelectronic component as claimed in claim 1, wherein the optoelectronic component is formed as or comprises a photodetector, solar cell and/or light emitting diode.

3. The optoelectronic component as claimed in claim 1, wherein the optoelectronic component is formed in a planar fashion.

4. The optoelectronic component as claimed in claim 1, wherein the first contact structure is formed in the edge region of the optically active region.

5. The optoelectronic component as claimed in claim 1, wherein the second contact structure is formed in a cavity in the electrically insulating molding compound.

6. The optoelectronic component as claimed in claim 1, wherein the encapsulation structure further comprises a functional region, wherein the functional region is formed on or above the optically active region.

7. The optoelectronic component as claimed in claim 1, wherein the encapsulation structure has a thickness in a range of approximately 1μm to approximately 20 mm.

8. The optoelectronic component as claimed in claim 1, wherein a predefined distance from the second contact structure to the lateral geometrical edge of the optoelectronic component is complied with.

9. The optoelectronic component as claimed in claim 1, wherein the first contact structure and the optically active region are arranged laterally adjacent to each other on a same surface of a common substrate.

10. The optoelectronic component as claimed in claim 1, wherein the first contact structure comprises one or more contacts and the electrically conductive structure electrically connects each of the one or more contacts of the first contact structure to the second contact structure.

11. A method for forming an optoelectronic component, the method comprising:
   forming an optically active region for taking up and/or for providing electromagnetic radiation, and a first contact structure, which is electrically conductively coupled to the optically active region; wherein the first contact structure and the optically active region are arranged laterally next to each other on a common support;
   providing a leadframe including an electrically conductive structure and a second contact structure; wherein the electrically conductive structure includes an electrical contact region, wherein the electrically conductive structure is electromechanically connected to the first contact structure by means of the electrical contacting region, the electromechanical connection being in a force-locking fashion,
   forming an encapsulation structure on or above the optically active region
   wherein the encapsulation structure is at least partly formed from an electrically insulating molding compound and the electrically conductive structure is at least partly embedded into the electrically insulating molding compound of the encapsulation structure, and the second contact structure is at least partly exposed;
   wherein the encapsulation structure is on or above the first contact structure and the optically active region and the electrically conductive structure electrically conductively connects the first contact structure to the second contact structure, wherein the optically active region and the first contact structure are encapsulated by the encapsulation structure.

12. The method as claimed in claim 11, wherein the optoelectronic component is formed as or comprises a photodetector, solar cell and/or light emitting diode.

13. The method as claimed in claim 11, wherein forming the encapsulation structure comprises at least one primary forming method with regard to the electrically insulating molding compound, the primary method being selected from injection molding, mold casting or die casting.

14. The method as claimed in claim 11, wherein the electrically insulating molding compound is formed in thermoelastic fashion in a temperature range of approximately −40° C. to approximately +80° C.

15. The method as claimed in claim 11, wherein the first contact structure and the optically active region are arranged laterally adjacent to each other on a same surface of a common substrate.

16. The method as claimed in claim 11, wherein the first contact structure comprises one or more contacts and the electrically conductive structure electrically connects each of the one or more contacts of the first contact structure to the second contact structure.

* * * * *